(12) United States Patent
Sun et al.

(10) Patent No.: US 12,326,490 B1
(45) Date of Patent: Jun. 10, 2025

(54) OPTIMAL PULSE POWER MEASUREMENT METHOD AND SYSTEM FOR MULTINUCLEAR SIMULTANEOUS INTEGRATED MAGNETIC RESONANCE IMAGING

(71) Applicant: Harbin Medical University, Harbin (CN)

(72) Inventors: Xilin Sun, Harbin (CN); Chunsheng Yang, Harbin (CN); Kai Wang, Harbin (CN); Yongyi Wu, Harbin (CN); Lijiao Wang, Harbin (CN); Lili Yang, Harbin (CN); Lina Wu, Harbin (CN); Zhaoguo Han, Harbin (CN); Limin Zheng, Harbin (CN)

(73) Assignee: HARBIN MEDICAL UNIVERSITY, Harbin (CN)

( * ) Notice: Subject to any disclaimer, the term of this patent is extended or adjusted under 35 U.S.C. 154(b) by 0 days.

(21) Appl. No.: 19/006,296

(22) Filed: Dec. 31, 2024

Related U.S. Application Data

(63) Continuation of application No. PCT/CN2024/098456, filed on Jun. 11, 2024.

(30) Foreign Application Priority Data

Sep. 18, 2023 (CN) .......................... 202311197962.6

(51) Int. Cl.
*G01R 33/36* (2006.01)
(52) U.S. Cl.
CPC ............................ *G01R 33/3607* (2013.01)

(58) Field of Classification Search
CPC ................................................. G01R 33/3607
See application file for complete search history.

(56) References Cited

U.S. PATENT DOCUMENTS

| 5,064,638 A | 11/1991 | Moore et al. |
| 9,581,668 B2 * | 2/2017 | Waddell ............... G01R 33/543 |

(Continued)

FOREIGN PATENT DOCUMENTS

| CN | 107329100 A | 11/2017 |
| CN | 110850348 A | 2/2020 |

(Continued)

*Primary Examiner* — Gregory H Curran
(74) *Attorney, Agent, or Firm* — Bayramoglu Law Offices LLC

(57) ABSTRACT

An optimal pulse power measurement method for multinuclear simultaneous integrated magnetic resonance imaging includes the following steps: successively or simultaneously exciting multiple nuclides within a slice in a same repetition time (TR) of magnetic resonance imaging (MRI); applying, in a slice encoding gradient channel, a frequency encoding gradient in a direction opposite to a slice selection gradient, and acquiring free induction decay (FID) signals of all the nuclides; simultaneously changing shaped radiofrequency (RF) pulse power values of all the nuclides for multiple times, and acquiring multiple corresponding FID signals for each nuclide; and performing Fourier transform on the FID signals of each nuclide, selecting a spectral peak in an absolute spectrum, integrating the spectral peak for comparison, and taking a shaped RF pulse power value corresponding to a maximum signal intensity of each nuclide as an optimal shaped RF pulse power corresponding to a current TR.

10 Claims, 4 Drawing Sheets

(56) References Cited

U.S. PATENT DOCUMENTS 10,408,907 B2 * 9/2019 Zho .................... G01R 33/5617
2017/0160368 A1 * 6/2017 Shi ......................... G01R 33/58

FOREIGN PATENT DOCUMENTS

| | | |
|---|---|---|
| CN | 113945878 A | 1/2022 |
| CN | 116106806 A | 5/2023 |
| CN | 116930836 A | 10/2023 |
| JP | H0549610 A | 3/1993 |

* cited by examiner

OPTIMAL PULSE POWER MEASUREMENT METHOD AND SYSTEM FOR MULTINUCLEAR SIMULTANEOUS INTEGRATED MAGNETIC RESONANCE IMAGING

CROSS-REFERENCE TO THE RELATED APPLICATIONS

This application is the continuation application of International Application No. PCT/CN2024/098456, filed on Jun. 11, 2024, which is based upon and claims priority to Chinese Patent Application No. 202311197962.6, filed on Sep. 18, 2023, the entire contents of which are incorporated herein by reference.

TECHNICAL FIELD

The present disclosure relates to the technical field of magnetic resonance imaging (MRI), and in particular to an optimal pulse power measurement method and system for multinuclear simultaneous integrated magnetic resonance imaging.

BACKGROUND

Magnetic resonance imaging (MRI) has been widely used in preclinical research and medical diagnosis and treatment. Traditional MRI focuses on proton ($^1H$) imaging and can provide functional and morphological information. Endogenous non-$^1H$ nuclides such as phosphorus ($^{31}P$) and sodium ($^{23}Na$) in living organisms are also MR sensitive nuclides that can provide information which cannot be acquired solely by proton imaging. Exogenous fluorine ($^{19}F$) and xenon ($Xe^{129}$) probes have no background signal in living organisms, and thus are often used as targeting reagents, tracers, developers, etc. for in-vivo studies. Phosphorus compounds participate in energy metabolism of living organisms. During the occurrence and development of tumors, the proportion of different phosphorus compounds dynamically changes. However, there are many types of phosphorus compounds, with a wide range of spectral peak distribution and multiple spectral peaks, and even with some spectral peaks that overlap. These spectral peaks are different from spectral peaks (single peaks) of water and sodium salts in living organisms. Therefore, phosphorus compounds in living organisms cannot be directly used for imaging characterization. Usually, the spectral peaks of phosphorus compounds are acquired through spectral imaging methods, and are converted into images through data processing.

There are many MR sensitive nuclides in living organisms, such as oxygen ($^{17}O$) and potassium ($^{35/37}K$). Multinuclear simultaneous imaging has gradually attracted widespread attention. However, there is a significant difference in the transverse relaxation parameter $T_2$ and longitudinal relaxation parameter $T_1$ for each nuclide. Multinuclear simultaneous imaging is mainly designed to acquire the content and spatial distribution information of non-$^1H$ nuclides. It is very important to acquire $^1H$ nuclide images with a high signal-to-noise ratio (SNR). The gradient recalled echo (GRE) method, ultra short echo time (UTE) method, and chemical shift imaging (CSI) method have become commonly used methods for multinuclear simultaneous imaging. In these methods, in order to acquire the highest SNR in a determined pulse sequence repetition time (TR), Ernst angle $\alpha$ is used as the shaped radiofrequency (RF) pulse flip angle, $\alpha=\arccos(\exp(-TR/T_1))$. That is, the power of the shaped RF pulse is set to a power value corresponding to the Ernst angle.

As described in Chinese patent ZL202310366296.8, the flip angle of the nuclide is determined based on its $T_1$. Chinese patent ZL202310366296.8 proposes a method for determining a multinuclear imaging parameter. In this method, the imaging parameter is determined based on known data, including the relaxation time constants $T_1$ and $T_2$ of the nuclide, as well as the corresponding relationship between the RF emission voltage (which can be converted into power) and the excitation pulse flip angle. However, in practical applications, the $T_1$ of each nuclide is unknown and the measurement process of $T_1$ is cumbersome and time-consuming. Therefore, in order to acquire molecular events related to time and space in living organisms, it is usually necessary to acquire images of multiple nuclides within a determined time frame. In other words, the key parameter TR that affects the imaging time is determined or constrained. Therefore, in multinuclear simultaneous imaging, it is important to set the shaped RF pulse power of each nuclide to acquire multinuclear images with high SNR, given a preset TR but unknown $T_1$ (i.e. unknown Ernst angle) for each nuclear. However, currently, there is a lack of a mature method.

SUMMARY

The present disclosure proposes an optimal pulse power measurement method and system for multinuclear simultaneous integrated magnetic resonance imaging. The present disclosure significantly shortens the measurement time for parameter optimization and ensures that images with a high signal-to-noise ratio (SNR) can be acquired for each nuclide in later imaging.

The present disclosure is implemented by the following technical solutions. An optimal pulse power measurement method for multinuclear simultaneous integrated magnetic resonance imaging includes the following steps:

(1) selectively simultaneously exciting, by combining shaped radiofrequency (RF) pulses and a slice selection gradient, multinuclear within a slice in a same pulse sequence repetition time (TR) of magnetic resonance imaging (MRI); and applying, in a slice encoding gradient channel, a frequency encoding gradient in a direction opposite to the slice selection gradient, and acquiring free induction decay (FID) signals of all the nuclides;

alternatively, selectively exciting, by combining a shaped RF pulse and a slice selection gradient, one or more nuclides within a slice in advance; applying, in a slice encoding gradient channel, a frequency encoding gradient in a direction opposite to the slice selection gradient, and acquiring an FID signal of the nuclide excited in advance; selectively simultaneously exciting, by combining shaped RF pulses and the slice selection gradient, multiple other nuclides within the slice; and applying, in the slice encoding gradient channel, the frequency encoding gradient in the direction opposite to the slice selection gradient, and acquiring FID signals of the multiple other nuclides;

(2) simultaneously changing shaped RF pulse power values of all the nuclides for multiple times, and repeating the step (1) to acquire multiple FID signals corresponding to the shaped RF pulse power values of each nuclide; and (3) performing Fourier transform on the multiple FID signals of each nuclide in the step (2) to acquire a spectrum of the nuclide within the slice and acquire an absolute spectrum of the spectrum; integrating the absolute spectrum of each nuclide, and marking an integral value as a signal intensity of the nuclide within the slice; and taking a shaped RF pulse power value corresponding to a maximum signal intensity of each nuclide as an optimal shaped RF pulse power corresponding to a current pulse sequence TR.

Furthermore, in the step (1), when the nuclides are simultaneously excited, equivalent centers of all the shaped RF pulses are aligned with an expected center of the slice selection gradient.

Furthermore, the step (2) includes simultaneously changing the shaped RF pulse powers of all the nuclides by gradually changing the shaped RF pulse powers at an equal interval and in an ascending order, with a range of change in the shaped RF pulse powers satisfying a condition that the signal intensity of each nuclide first increases to a maximum value and then decreases.

Furthermore, the interval is a distinguishable interval of an RF transmitter in an MRI system or an integral multiple of the distinguishable interval.

The present disclosure further proposes an optimal pulse power measurement system for multinuclear simultaneous integrated magnetic resonance imaging includes the following functional modules:

a data acquisition module, configured to acquire FID signal data of all imaging nuclides acquired by a multinuclear MRI system, power values, shapes and pulse widths of shaped RF pulses corresponding to the imaging nuclides, slice thickness, and TR;

a data processing module, configured to perform Fourier transform on the FID signal data of all the imaging nuclides, acquire a spectrum, extract an absolute spectrum, select a spectral peak in the absolute spectrum, integrate the spectral peak for comparison, and determine an optimal shaped RF pulse power; and a data output module, configured to output the optimal shaped RF pulse power to the multinuclear MRI system, and archive an optimal power value, a shape and a width of a shaped RF pulse of each nuclide, as well as the slice thickness and the pulse sequence TR.

The present disclosure has the following beneficial effects:

1. The present disclosure proposes an optimal pulse power measurement method and system for multinuclear simultaneous integrated magnetic resonance imaging. The present disclosure is capable of simultaneously acquiring the FID signals of different nuclides within a given pulse sequence TR, and simultaneously acquiring the optimal shaped RF pulse power of each nuclide through data processing. Therefore, the present disclosure ensures that images of a high SNR can be acquired for each nuclide in later imaging.

2. The present disclosure immediately acquires the signals of nuclides after exciting them with the shaped RF pulses. The echo time is only the width of the shaped RF pulse. The short echo time avoids the influence of imperfections in the MRI system such as magnetic field bump, and can acquire measurement signals with high SNR, ensuring the accuracy of the acquired shaped RF pulse power.

3. The present disclosure achieves signal acquisition of multiple nuclides within the same TR, significantly reducing the measurement time for parameter optimization.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show merely some embodiments of the present disclosure, and a person of ordinary skill in the art may still derive other drawings from these drawings without creative efforts.

DETAILED DESCRIPTION OF THE EMBODIMENTS

The technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts should fall within the protection scope of the present disclosure.

Figure 1:
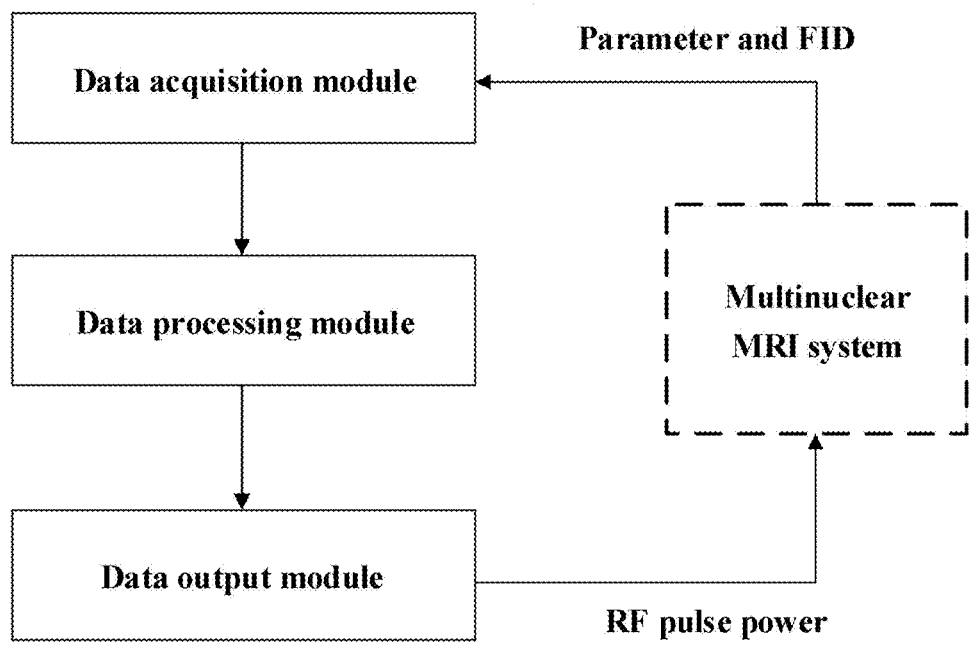
FIG. 1 is a structural block diagram of an optimal pulse power measurement system for multinuclear simultaneous integrated magnetic resonance imaging according to the present disclosure.

FIG. 1 is a functional block diagram of an optimal pulse power measurement system for multinuclear simultaneous integrated magnetic resonance imaging according to the present disclosure. The present disclosure provides a measurement method embodiment, which can run on a computer, a terminal, or a similar computing system. For example, in the case of a terminal, the terminal includes one or more processors as a data acquisition module to achieve a data acquisition function. The data acquisition module is configured to acquire FID signal data of all imaging nuclides from a multinuclear MRI system, as well as power values, shapes, and pulse widths of shaped RF pulses corresponding to the imaging nuclides, and parameters such as slice thickness and TR that need to be recorded.

The terminal may further include one or more processors as a data processing module. The data processing module is configured to perform Fourier transform on the FID signal data of all the imaging nuclides, acquire a spectrum, extract an absolute spectrum, select a spectral peak in the absolute spectrum, and integrate the spectral peak for comparison, and determine a shaped RF pulse power corresponding to a maximum signal intensity of each nuclide as an optimal shaped RF pulse power for each nuclide.

The terminal may further include one or more processors as a data output module. The data output module is configured to output the determined optimal shaped RF pulse power of each nuclide to the multinuclear MRI system, and archive parameters related to a current shaped RF pulse such as shape and pulse width, slice thickness, TR, and the corresponding optimal shaped RF pulse power of each nuclide for later use.

Those of ordinary skill in the art should understand that the terminal or computing system may also implement the functions of the three functional modules shown in FIG. 1 through a processor, and even achieve the function of the optimal pulse power measurement system for multinuclear simultaneous integrated magnetic resonance imaging through a program deployed on a computer.

Embodiment 1

Figure 2:
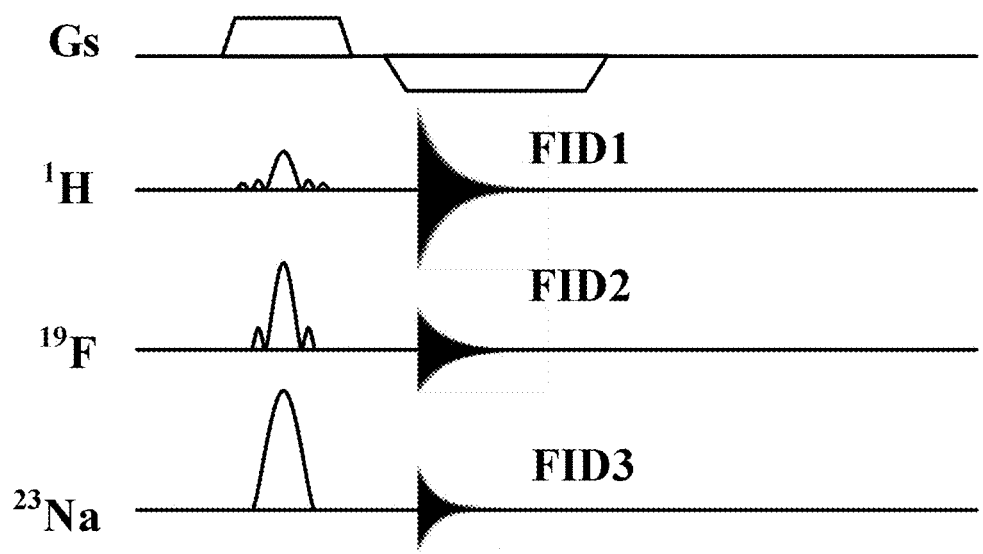
FIG. 2 is an MRI pulse sequence of three nuclides $^{1}H$, $^{19}F$, and $^{23}Na$ in one TR, with a horizontal axis representing a time axis.

As shown in FIG. 2, a method for measuring an optimal pulse power for three-nuclear ($^1H/^{19}F/^{23}Na$) simultaneous integrated imaging includes the following steps.

(1) SINC, Hermite, and Gauss shaped RF pulses are combined with a slice selection gradient to selectively simultaneously excite three nuclides of $^1H$, $^{19}F$, and $^{23}Na$ within a slice in a same pulse sequence TR. Centers of the three shaped RF pulses are aligned with an expected center of the slice selection gradient, and powers of the three shaped RF pulses are represented by a same parameter, i.e. plvl. In slice encoding gradient channel Gs, a frequency encoding gradient is applied in a direction opposite to the slice selection gradient, and FID signals FID1, FID2, and FID3 of the three nuclides of $^1H$, $^{19}F$, and $^{23}Na$ are acquired.

(2) The shaped RF pulse power values plvl of the three nuclides of $^1H$, $^{19}F$, and $^{23}Na$ are simultaneously changed at an equal interval in an ascending order, and the step (1) is repeated to acquire multiple FID signals corresponding to the shaped RF pulse power values plvl of each nuclide.

(3) Fourier transform is performed on the FID signals FID1, FID2, and FID3 of the three nuclides of $^1H$, $^{19}F$, and $^{23}Na$ to acquire spectra of $^1H$, $^{19}F$, and $^{23}Na$ nuclides within the slice. Absolute spectra of $^1H$, $^{19}F$, and $^{23}Na$ are extracted and integrated. Integral values are marked as signal intensities of the $^1H$, $^{19}F$, and $^{23}Na$ nuclides within the slice. The shaped RF pulse power value corresponding to a maximum signal intensity of each nuclide is taken as an optimal shaped RF pulse power corresponding to a current pulse TR.

Embodiment 2

Figure 3:
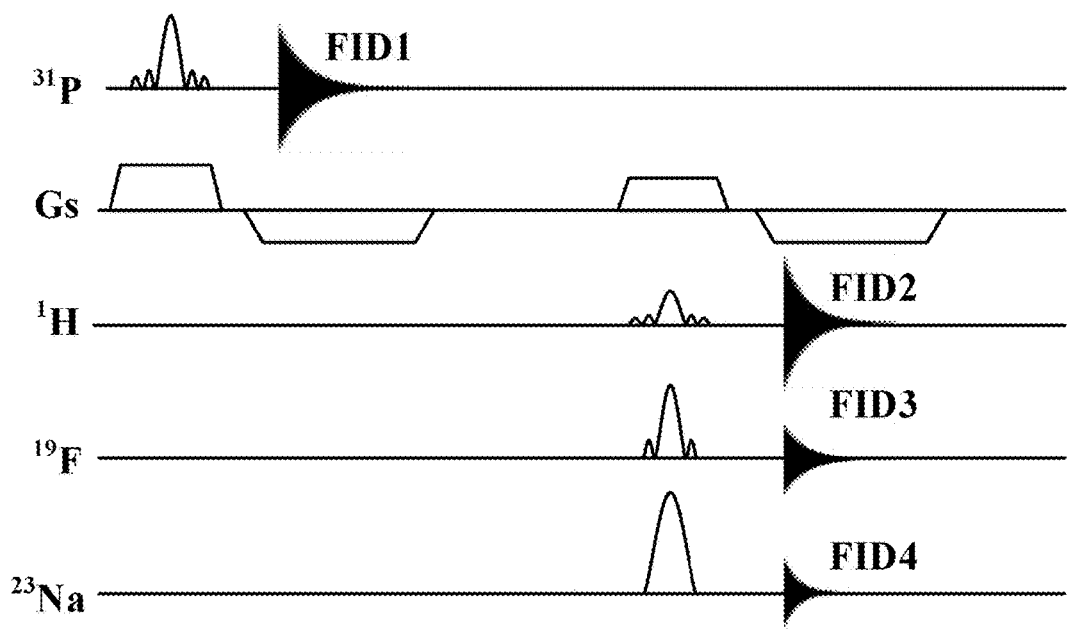
FIG. 3 is an MRI pulse sequence in one TR, where $^{31}P$ is first excited, followed by $^{1}H$, $^{19}F$, and $^{23}Na$ that are simultaneously excited, and a horizontal axis represents a time axis.
Figure 4:
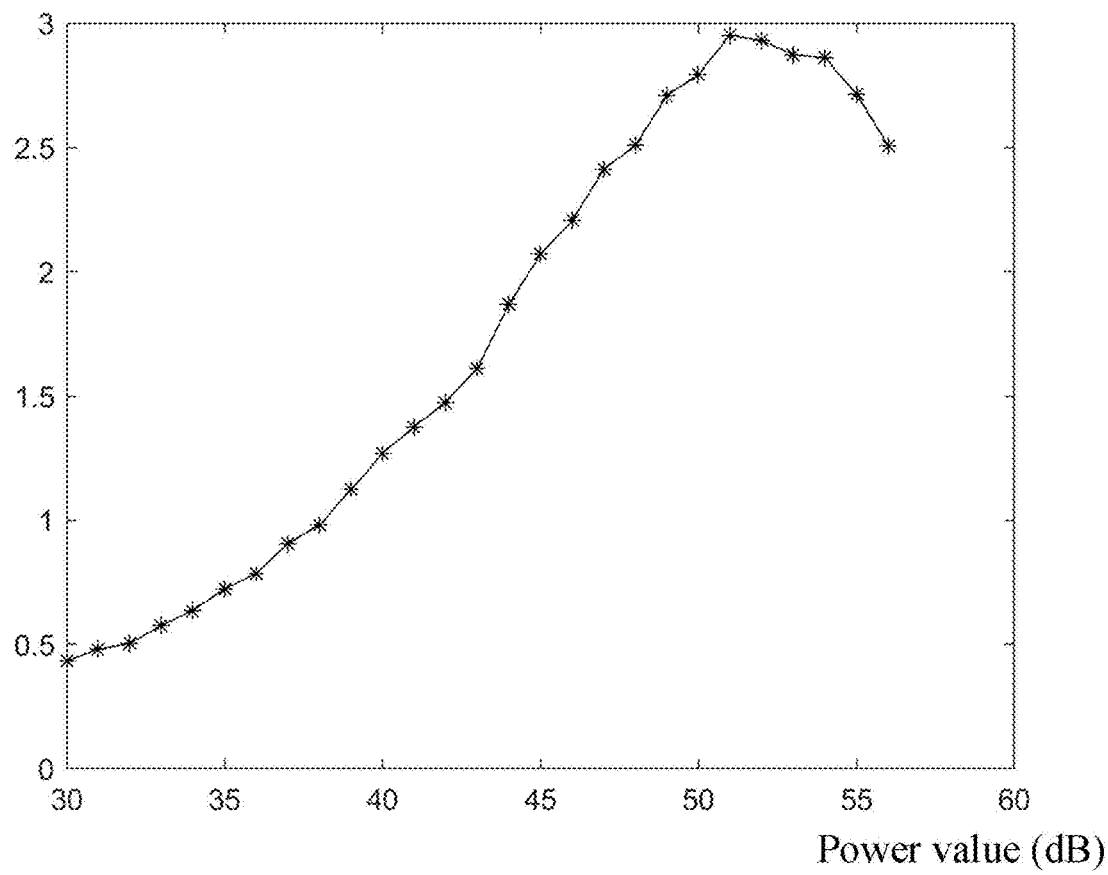
FIG. 4 is a variation curve of a signal intensity of $^{31}P$ with a pulse power.
Figure 5:
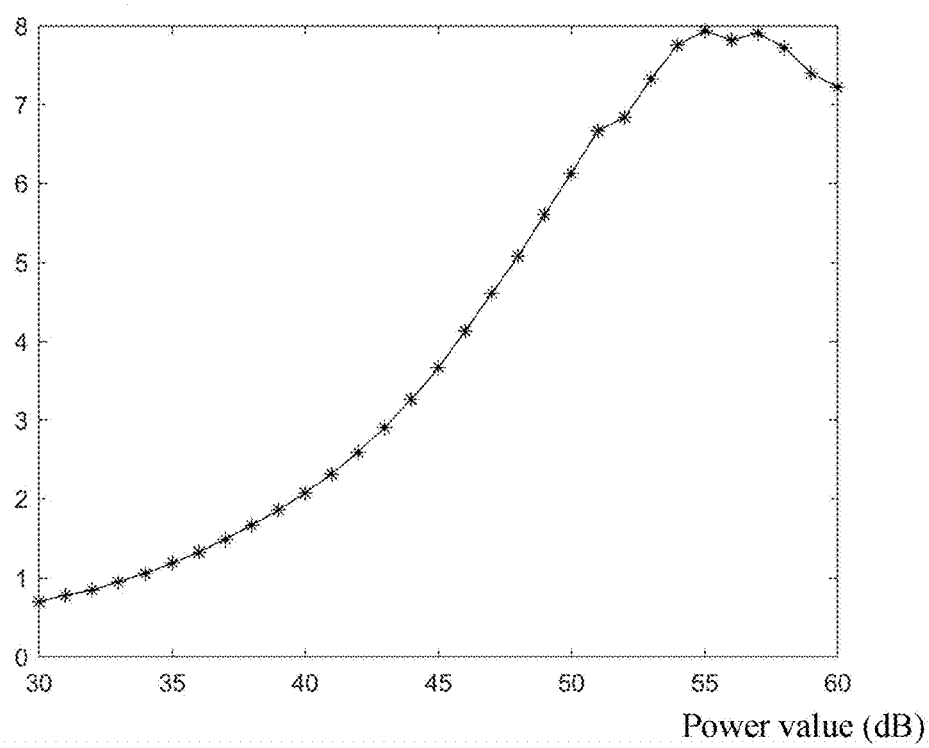
FIG. 5 is a variation curve of a signal intensity of $^{1}H$ with a pulse power.
Figure 6:
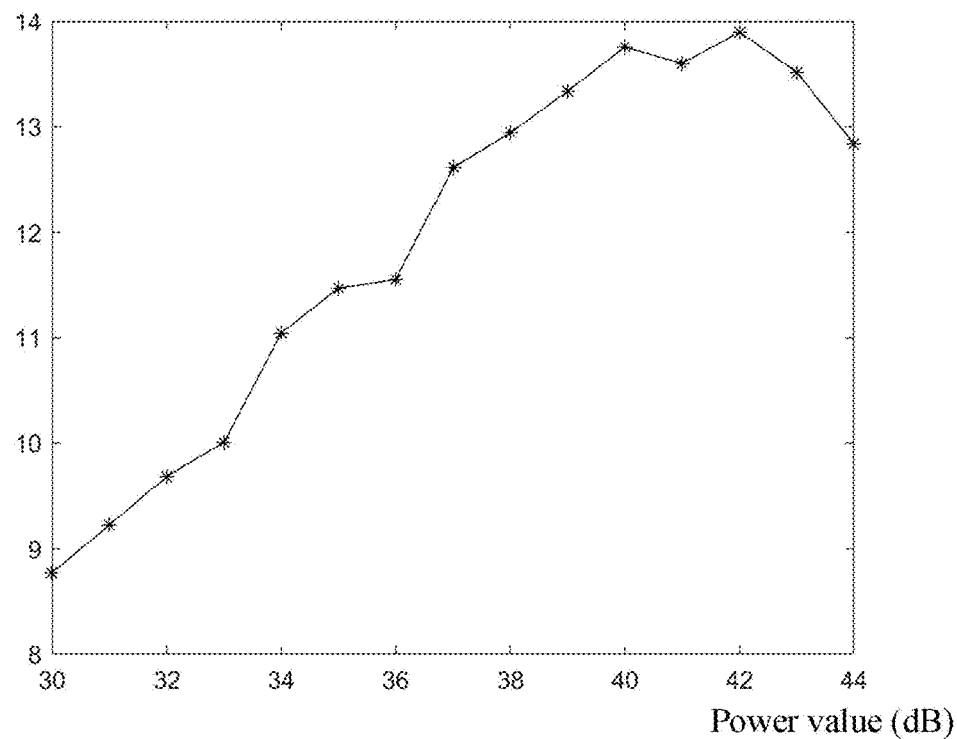
FIG. 6 is a variation curve of a signal intensity of $^{19}F$ with a pulse power.
Figure 7:
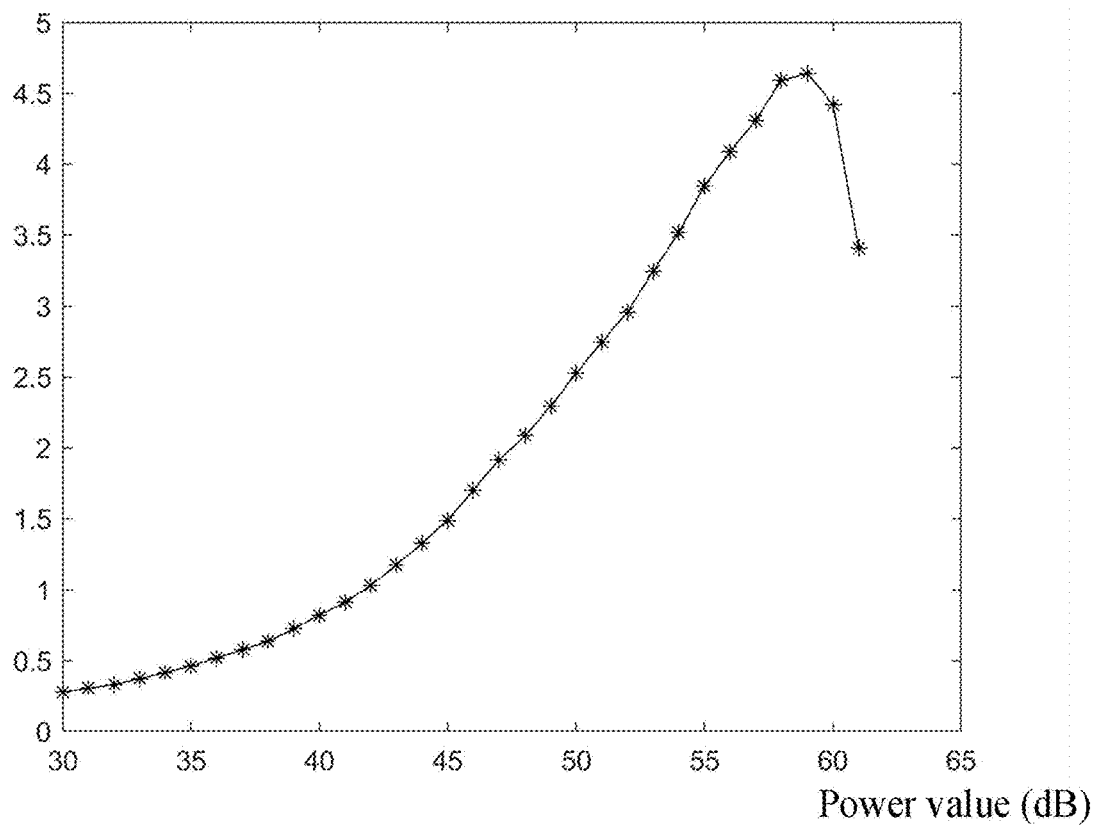
FIG. 7 is a variation curve of a signal intensity of $^{23}Na$ with a pulse power.

As shown in FIG. 3, a method for measuring an optimal pulse power for four-nuclear ($^{31}P/^1H/^{19}F/^{23}Na$) simultaneous integrated imaging includes the following steps.

(1) A SINC shaped RF pulses is combined with a slice selection gradient to selectively excite a nuclide of $^{31}P$ within a slice in a same pulse sequence TR. A power value of the shaped RF pulse is represented by parameter plvl. In slice encoding gradient channel Gs, a frequency encoding gradient is applied in a direction opposite to the slice selection gradient, and FID signal of the nuclide $^{31}P$, i.e. FID1, is acquired.

Then, SINC, Hermite, and Gauss shaped RF pulses are combined with the slice selection gradient to selectively simultaneously excite three nuclides of $^1H$, $^{19}F$, and $^{23}Na$ within the slice. Equivalent centers of the three shaped RF pulses are aligned with an expected center of the slice selection gradient, and power values of the three shaped RF pulses are represented by parameter plvl. In the slice encoding gradient channel Gs, the frequency encoding gradient is applied in the direction opposite to the slice selection gradient, and FID signals of the three nuclides of $^1H$, $^{19}F$, and $^{23}Na$, i.e. FID2, FID3, and FID4, are acquired.

(2) The shaped RF pulse powers plvl of the four nuclides of $^{31}P$, $^1H$, $^{19}F$, and $^{23}Na$ are simultaneously changed in an ascending order, and the step (1) is repeated to acquire multiple FID signals corresponding to the shaped RF pulse powers plvl of each nuclide.

(3) Fourier transform is performed on the FID signals FID1, FID2, FID3, and FID4 of the four nuclides of $^{31}P$, $^1H$, $^{19}F$, and $^{23}Na$ to acquire spectra of the $^{31}P$, $^1H$, $^{19}F$, and $^{23}Na$ nuclides within the slice. Absolute spectra of $^{31}P$, $^1H$, $^{19}F$, and $^{23}Na$ are extracted and integrated. Integral values are marked as signal intensities of the $^{31}P$, $^1H$, $^{19}F$, and $^{23}Na$ nuclides within the slice. The shaped RF pulse power corresponding to a maximum signal intensity of each nuclide is taken as an optimal shaped RF pulse power corresponding to a current pulse TR.

According to the measurement method of Embodiment 2, a mixed solution of 2 mmol/mL trifluoroethanol and 0.8 mmol/mL sodium dihydrogen phosphate is used as a sample to perform an online experiment by a multinuclear MRI system, with a slice thickness of 10 mm, a shaped RF pulse width of 2 ms, and a TR of 800 ms. The experiment is designed to simultaneously test changes in the signal intensities of $^{31}P$, $^1H$, $^{19}F$, and $^{23}Na$ with the pulse power. The results acquired are shown in FIGS. 4, 5, 6, and 7, respectively. In the multinuclear MRI system, the shaped RF pulse power is expressed in relative dB. The signal variation trend of each nuclide is consistent with the expectations of the present disclosure. The thickness of the four nuclides of $^{31}P$, $^1H$, $^{19}F$, and $^{23}Na$ in the slice is 10 mm, and the TR is 800 ms. The excitation pulses are SINC, SINC, Hermite, and Gauss shaped RF pulses, respectively. The optimal pulse power corresponding to the width of 2 ms is 51 dB, 55 dB, 42 dB, and 58 dB, respectively.

Embodiment 3

This embodiment is basically the same as Embodiment 2, except that in the step (1), $^{23}Na$ and $^{31}P$ are simultaneously excited in advance, followed by the simultaneous excitation of $^1H$ and $^{19}F$.

Figure 8:
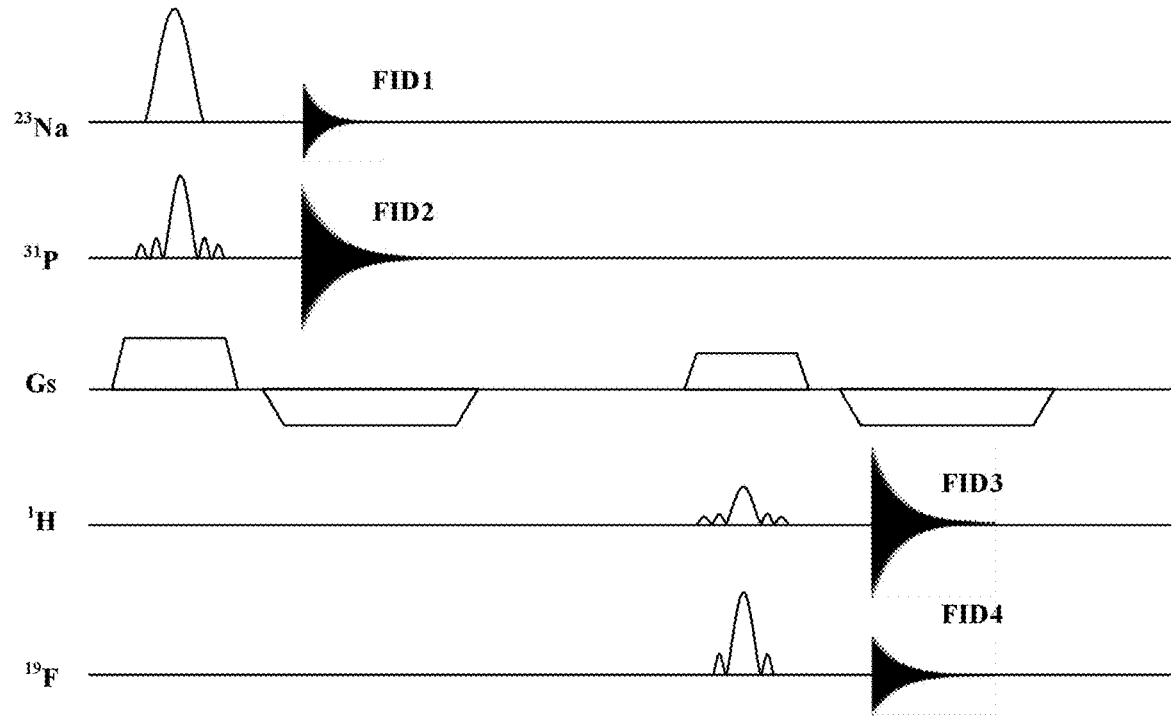
FIG. 8 is an MRI pulse sequence in one TR, where $^{23}Na$ and $^{31}P$ are first excited, followed by $^{1}H$ and $^{19}F$ that are simultaneously excited, and a horizontal axis represents a time axis.

As shown in FIG. 8, a method for measuring an optimal pulse power for four-nuclear ($^{23}Na/^{31}P/^1H/^{19}F$) simultaneous integrated imaging includes the following steps.

(1) Gauss and SINC shaped RF pulses are combined with a slice selection gradient to selectively simultaneously excite nuclides $^{23}Na$ and $^{31}P$ within a slice in a same pulse sequence TR. Power values of the two shaped RF pulses are represented by parameter plvl. In slice encoding gradient channel Gs, a frequency encoding gradient is applied in a direction opposite to the slice selection gradient, and FID signals of the nuclides $^{23}Na$ and $^{31}P$, i.e. FID1 and FID2, are acquired.

Then, SINC, Hermite, and Gauss shaped RF pulses are combined with the slice selection gradient to selectively simultaneously excite nuclides of $^1H$ and $^{19}F$ within the slice. Equivalent centers of the two shaped RF pulses are aligned with an expected center of the slice selection gradient, and power values of the shaped RF pulses are represented by parameter plvl. In the slice encoding gradient channel Gs, the frequency encoding gradient is applied in the direction opposite to the slice selection gradient, and FID signals of the two nuclides of $^1H$ and $^{19}F$, i.e. FID3 and FID4, are acquired.

(2) The shaped RF pulse powers plvl of the four nuclides of $^{23}Na$, $^{31}P$, $^1H$, and $^{19}F$ are simultaneously changed in an ascending order, and the step (1) is repeated to acquire multiple FID signals corresponding to the shaped RF pulse powers plvl of each nuclide.

(3) Fourier transform is performed on the FID signals FID1, FID2, FID3, and FID4 of the four nuclides of $^{23}$Na, $^{31}$P, $^1$H, and $^{19}$F to acquire spectra of the $^{23}$Na, $^{31}$P, $^1$H, and $^{19}$F nuclides within the slice. Absolute spectra of $^{23}$Na, $^{31}$P, $^1$H, and $^{19}$F are extracted and integrated. Integral values are marked as signal intensities of the $^{23}$Na, $^{31}$P, $^1$H, and $^{19}$F nuclides within the slice. The shaped RF pulse power corresponding to a maximum signal intensity of each nuclide is taken as an optimal shaped RF pulse power corresponding to a current pulse TR.

The above described are merely preferred embodiments of the present disclosure, and not intended to limit the present disclosure. Any modifications, equivalent replacements and improvements made within the spirit and principle of the present disclosure should all fall within the scope of protection of the present disclosure.

What is claimed is:

1. An optimal pulse power measurement method for multinuclear simultaneous integrated magnetic resonance imaging, comprising the following steps:
   (1) selectively simultaneously exciting, by combining shaped radiofrequency (RF) pulses and a slice selection gradient, multiple nuclides within a slice in a same pulse sequence repetition time (TR) of magnetic resonance imaging (MRI); and applying, in a slice encoding gradient channel, a frequency encoding gradient in a direction opposite to the slice selection gradient, and acquiring free induction decay (FID) signals of all the nuclides;
   alternatively, selectively exciting, by combining a shaped RF pulse and a slice selection gradient, one or more nuclides within a slice in advance; applying, in a slice encoding gradient channel, a frequency encoding gradient in a direction opposite to the slice selection gradient, and acquiring an FID signal of the nuclide excited in advance; selectively simultaneously exciting, by combining shaped RF pulses and the slice selection gradient, multiple other nuclides within the same slice; and applying, in the slice encoding gradient channel, the frequency encoding gradient in the direction opposite to the slice selection gradient, and acquiring FID signals of the multiple other nuclides;
   (2) simultaneously changing shaped RF pulse power values of all the nuclides for multiple times, and repeating the step (1) to acquire multiple FID signals corresponding to the shaped RF pulse power values of each nuclide; and
   (3) performing Fourier transform on the multiple FID signals of each nuclide in the step (2) to acquire a spectrum of the nuclide within the slice and extract an absolute spectrum of the spectrum; integrating the absolute spectrum of each nuclide, and marking an integral value as a signal intensity of the nuclide within the slice; and taking a shaped RF pulse power value corresponding to a maximum signal intensity of each nuclide as an optimal shaped RF pulse power corresponding to a current pulse sequence TR.

2. The optimal pulse power measurement method according to claim 1, wherein in the step (1), when the nuclides are simultaneously excited, equivalent centers of all the shaped RF pulses are aligned with an expected center of the slice selection gradient.

3. The optimal pulse power measurement method according to claim 2, wherein the step (2) of the method comprises simultaneously changing the shaped RF pulse powers of all the nuclides by gradually changing the shaped RF pulse powers at an equal interval and in an ascending order, with a range of change in the shaped RF pulse powers satisfying a condition that the signal intensity of each nuclide first increases to a maximum value and then decreases.

4. The optimal pulse power measurement method according to claim 3, wherein the equal interval is a distinguishable interval of an RF transmitter in an MRI system or an integral multiple of the distinguishable interval.

5. The optimal pulse power measurement method according to claim 1, wherein the step (2) comprises simultaneously changing the shaped RF pulse powers of all the nuclides by gradually changing the shaped RF pulse powers at an equal interval and in an ascending order, with a range of change in the shaped RF pulse powers satisfying a condition that the signal intensity of each nuclide first increases to a maximum value and then decreases.

6. The optimal pulse power measurement method according to claim 5, wherein the equal interval is a distinguishable interval of an RF transmitter in an MRI system or an integral multiple of the distinguishable interval.

7. An optimal pulse power measurement system for multinuclear simultaneous integrated magnetic resonance imaging, used for the method according to claim 1, and comprising:
   a data acquisition module, configured to acquire FID signal data of all imaging nuclides acquired by a multinuclear MRI system, power values, shapes and pulse widths of shaped RF pulses corresponding to the imaging nuclides, slice thickness, and pulse sequence TR;
   a data processing module, configured to perform Fourier transform on the FID signal data of all the imaging nuclides, acquire a spectrum, extract an absolute spectrum, select a spectral peak in the absolute spectrum, integrate the spectral peak for comparison, and determine an optimal shaped RF pulse power; and
   a data output module, configured to output the optimal shaped RF pulse power to the multinuclear MRI system, and archive an optimal power value, a shape and a width of a shaped RF pulse of each nuclide, as well as the slice thickness and the pulse sequence TR.

8. The optimal pulse power measurement system according to claim 7, wherein in the step (1) of the method, when the nuclides are simultaneously excited, equivalent centers of all the shaped RF pulses are aligned with an expected center of the slice selection gradient.

9. The optimal pulse power measurement system according to claim 7, wherein the step (2) of the method comprises simultaneously changing the shaped RF pulse powers of all the nuclides by gradually changing the shaped RF pulse powers at an equal interval and in an ascending order, with a range of change in the shaped RF pulse powers satisfying a condition that the signal intensity of each nuclide first increases to a maximum value and then decreases.

10. The optimal pulse power measurement system according to claim 9, wherein the equal interval is a distinguishable interval of an RF transmitter in an MRI system or an integral multiple of the distinguishable interval.

* * * * *